United States Patent [19]

Takahashi

[11] Patent Number: 4,766,465

[45] Date of Patent: Aug. 23, 1988

[54] CARRY DEVICE FOR FINE MOVEMENT

[75] Inventor: Kazuo Takahashi, Kawasaki, Japan

[73] Assignee: Canon Kabushiki Kaisha, Tokyo, Japan

[21] Appl. No.: 936,972

[22] Filed: Nov. 26, 1986

Related U.S. Application Data

[63] Continuation of Ser. No. 566,166, Dec. 28, 1983, abandoned.

[30] Foreign Application Priority Data

Jan. 8, 1983 [JP] Japan .................................. 58-1576

[51] Int. Cl.[4] ........................ B23Q 3/18; B23Q 16/08; B23Q 16/12; B23K 37/04
[52] U.S. Cl. ............................ 355/53; 148/DIG. 46; 148/DIG. 102; 228/49.1; 250/491.1; 269/73; 350/529; 350/531
[58] Field of Search ..................... 29/569 R, 721, 760; 250/491.1; 350/529, 531; 228/49.1; 269/71, 73

[56] References Cited

U.S. PATENT DOCUMENTS 4,126,376 11/1978 Gommel .............................. 350/531
4,358,198 9/1982 Moriyama et al. .................. 355/53
4,492,356 1/1985 Taniguchi et al. .................... 269/73

FOREIGN PATENT DOCUMENTS 0038072 10/1981 European Pat. Off. .
77559 4/1983 European Pat. Off. .......... 29/569 R
1911908 9/1970 Fed. Rep. of Germany .
9455 1/1977 Japan .................................. 350/529
57-61437 4/1982 Japan .
57-83329 5/1982 Japan .

OTHER PUBLICATIONS

Bednorz et al., "Piezoelectric XY Translator" IBM Technical Discl. Bull. vol. 26 No. 10A 4/84.
Kingery et al., Introduction to Ceramics, John Wiley & Sons 1976.
Brinkmann–Micro Manipulators, Precision–Made Mechanical Positioners for Science and Industry.

Primary Examiner—Olik Chaudhuri
Attorney, Agent, or Firm—Fitzpatrick, Cella, Harper & Scinto

[57] ABSTRACT

A carriage for fine movement includes a stationary stage, a movable stage slidably provided thereon, a moving mechanism, coupled to the stationary and movable stages, for moving the movable stage relative to the stationary stage, wherein at least one of the stationary stage, movable stage and moving mechanism is of a fine ceramic material to prevent distortion and variation with time to enhance the abrasion resistance.

5 Claims, 1 Drawing Sheet

CARRY DEVICE FOR FINE MOVEMENT

This application is a continuation of application Ser. No. 566,166, filed Dec. 28, 1983, now abandoned.

BACKGROUND OF THE INVENTION

1. Field of the Invention

The present invention relates to a carrying device for carrying a member and moving it in a certain linear direction and another linear direction, e.g. perpendicular thereto and/or for rotating it. The device to which the present invention relates is called usually an X-Y stage. Such devices, what are capable of accurately operating at a high speed and with a fine movement, are used in semiconductor circuits manufacturing machines, such as projection mask aligners or electron beam patterning machines, and in semiconductor device manufacturing machines, such as wire bonders, and further in inspecting machines for materials, for the purpose of accurate positioning.

2. Description of the Prior Art

The X-Y stages are widely used in the abovementioned field. Particularly in the field of the semiconductor circuits manufacturing machines, the X-Y stage has movable portions made of a light alloy including Al, Ti or Mg to make itself lighter to meet the requirement for high speed movement. However, those light alloy materials have the drawbacks of less rigidity, deformation with temperature change, less abrasion resistance and less resistance to rusting.

To maintain the high precision of a fine X-Y stage is very difficult in view of the variation, with time, of metal materials.

In the field of the electron beam patterning machines which have come to be used in the semiconductor circuits manufacturing, the stages have to be of a non-magnetic material to allow the proper control of the electron beam, so that it is difficult to make them lighter. Further, the stages have to be operated in vacuum in some cases so that lubrication can be used only limitedly with the result of degrading the abrasion resistance.

SUMMARY OF THE INVENTION

Accordingly, it is a principal object of the present invention to provide a carrying device which is substantially free from deformation by weight or by changes of ambient conditions and from variations with time.

It is another object of the present invention to provide a carrying device wherein the wearing by the sliding action between a carriage and a supporter is tremendously reduced.

It is a further object of the present invention to provide a carrying device which does not influence particles having electric charge.

It is a yet further object of the present invention to provide a carrying device which works satisfactorily even in vacuum.

These and other objects, features and advantages of the present invention will become more apparent upon a consideration of the following description of the preferred embodiment of the present invention taken in conjunction with the accompanying drawings.

DESCRIPTION OF THE PREFERRED EMBODIMENTS

Figure 1:
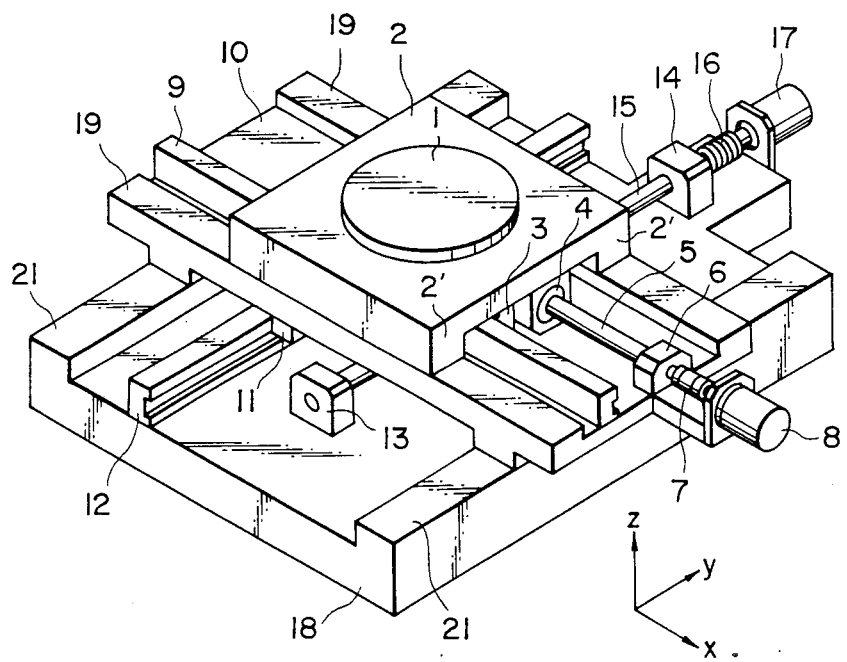
FIG. 1 is a perspective view of a device according to an embodiment of the present invention.

Preferred embodiments of the present invention will now be described in conjunction with the accompanying drawings. In FIG. 1, a chuck 1 of an alumina ceramic material is shown as vacuum attracting a semiconductor wafer or another material. The chuck 1 is internally provided with an unshown opening for the vacuum attraction and an unshown duct connected to a vacuum pump. The device of FIG. 1 includes an X-stage 2 of an alumina ceramic material which functions to move the chuck 1 in the X direction. The X-stage 2 includes a projection 2' which has a bottom surface slidable on another member which will be described hereinafter. The slidable surface may be coated with polytetrafluoroethylene material. Provided on the inside of the X-stage 2 is a slidable block 3 of an alumina ceramic material having a polytetrafluoroethylene coating on the slidable surface thereof. The slidable block 3 is in contact with a guiding rail 9 which will be described hereinafter. To the X-stage 2, a ball nut 4 of a ceramic material is coupled through a coupling so as to provide a moving force for the X-stage 2 and includes therein balls of non-metalic material, such as ceramic, ruby or sapphire. The ball nut 4 is engaged with a ball screw 5 of a ceramic material for the driving. A housing 6 of a ceramic material is used for supporting the ball screw 5, and accommodates and fixes a bearing for supporting the ball screw 5. The bearing is of a non-metalic material, such as ruby or sapphire. To the ball screw 5 is connected a transmission coupling 7 of a ceramic material for transmitting the driving force from a driving motor 8 for the X-stage 2. Designated by reference numeral 9 is a guide rail of a ceramic material for defining the linear movement of the X-stage 2. The guide rail 9 has a side face engaged to a roller 23 (FIG. 2) which is rotatable about a shaft and the other side face is engaged with the slidable block 3.

The device of FIG. 1 further includes a Y-stage 10 of a ceramic material which supports the projection 2' of the X-stage 2 and engaged with the X direction guide rail 9. Inside the Y-stage 10, there is a slidable block 11 of a ceramic material preferably coated with a polytetrafluoroethylene material. Designated by reference numeral 12 is a guide rail of a ceramic material for defining a linear movement of the Y-stage 10 and is coupled to a stationary or fixed stage 18 of a ceramic material. Housings 13 and 14 of a ceramic material support a ball screw 15 for the driving in Y direction and accommodate therein a bearing of a non-magnetic material, such as ceramic, ruby or sapphire. Although not shown in the drawings, the ball nut is engaged with a ball screw 15 and fixed on the inside of the Y-stage 10.

A transmission coupling 16 of a ceramic material is provided for transmitting a driving force from a motor 17 for driving the Y-stage is used. Sliding surfaces 19 and 21 of a ceramic material, which have been lapped to a mirror surface, support the bottom projection of the X-stage 2 and the bottom projection of the Y-stage 10, respectively.

Figures 2, 3:
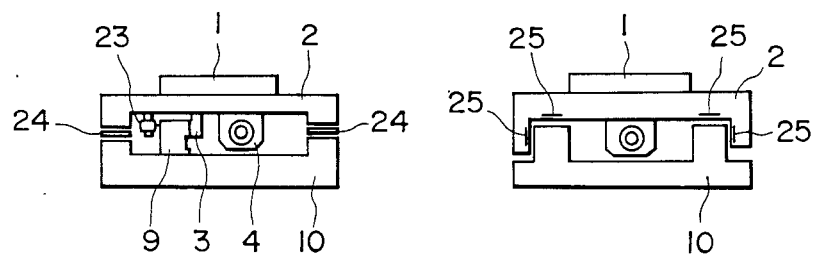
FIG. 2 is a cross-sectional view of an important part of a device according to another embodiment of the present invention.
FIG. 3 is a cross-sectional view of an important part of a device according to a further object of the present invention.

FIG. 2 shows a modified structure for supporting the X-stage 2. FIG. 3 shows a further modified structure for supporting the X-stage 2. The FIG. 2 structure includes members 24 which are rollers of a ceramic material or a non-metalic material arranged in the direction perpendicular to the sheet of the drawing to constitute a bearing. The members 24 may be needle bearings having a retainer of a polytetrafluoroethylene material. In the FIG. 3 structure, there is used a slide type air bearing having an air pad of a ceramic material connected to an unshown air duct.

Among those members described above, the sliding parts and the rolling parts are made of a fine ceramic material, and the other parts may be of an alloy such as an aluminium, as in conventional machines.

In operation, the motor 8 fixed to the Y-stage 10, when actuated, rotates the ball screw 5 through the coupling 7 so that the ball nut 4 engaged with the ball screw 5 is moved back and forth, with the result that the X-stage 2 fixed thereto is moved back and forth. The X-stage 2 slides on the flat surface 19 so that the movement thereof is confined in a plane without fluctuation, and it is confined by the guide rail 9 without the fluctuation in Y direction.

When the motor 17 fixed on the stationary stage 18 is actuated, the ball screw 15 rotates through the coupling 16 so that the Y-stage 10 moves back and forth. The Y-stage 10 moves on the flat surface 21 and is confined by the guide rail 12 to move correctly in the Y direction.

The couplings between the stages and the motors are of a ceramic material, because it can provide a high rigidity and low inertia so that the transmission of vibration from the moving device can be reduced.

If the entire stages are made of a ceramic material, which is non-magnetic, they can be used with an electron beam patterning machine which requires a non-magnetic stage, and also, they can be used with fine movement machines and fine measurement machines in the other fields wherein collosible chemical materials are liable to attach thereto. Since there is no possibility of rust when the ceramic is used, they can be used within chemical liquid. In view of the operability thereof in vacuum, they can be used in space.

In the foregoing embodiments, the stages have been explained as being linearly movable in orthogonal directions, but it will be readily apparent that the stages may be rotatable.

According to the present invention, the low rigidity which is liable to accompany with the tendency for the reduced weight, can be prevented. And, because of the low thermal conductivity of the ceramic material and the lower thermal expansion than ordinary metals, the device is substantially free from the possible influence of the ambient temperature. Further, the high hardness of the material provides a higher abrasion resistance. Although the conventional machines unavoidably involve the problem that the high accuracy cannot be maintained for a long period because of the variation of metals with time, the devices of the present invention can reduce such variations to a very small amount.

Also, since the ceramic material is hardly influenced by external vibrations, a stable performance can be maintained. There is no problem of linking as when metal is used. Further, sliding surface and rolling surface can be used without lubrication.

While the invention has been described with reference to the structures disclosed herein, it is not confined to the details set forth and this application is intended to cover such modifications or changes as may come within the purposes of the improvements or the scope of the following claims.

What is claimed is:

1. A stage for use in a semiconductor manufacturing apparatus that operates on a wafer, said stage comprising:

a wafer carrier for carrying a wafer and mounted for movement;

means for guiding the movement of said wafer carrier; and driving means for driving said wafer carrier along said guiding means, said driving means including driving force producing means and transmission means for transmitting the driving force produced thereby to said wafer carrier; said wafer carrier, said guiding means, and said transmission means being made of ceramic material.

2. A stage according to claim 1, further comprising a ball nut made of ceramic material provided with said carrier, and wherein said transmission means includes a ball screw made of ceramic material, said ball nut being engaged with and moved by rotation of said ball screw.

3. A stage according to claim 2, wherein said guiding means includes a bearing having a roller made of ceramic material.

4. A stage according to claim 2, wherein said guiding means includes a sliding surface made of ceramic material.

5. A stage according to claim 2, wherein said guiding means includes a fluid bearing having a pad made of ceramic material.

* * * * *

UNITED STATES PATENT AND TRADEMARK OFFICE
CERTIFICATE OF CORRECTION

PATENT NO. : 4,766,465

DATED : August 23, 1988

INVENTOR(S) : KAZUO TAKAHASHI

It is certified that error appears in the above-identified patent and that said Letters Patent is hereby corrected as shown below:

AT [56] IN REFERENCES CITED

U.S. Patent Documents, "Gommel" should read --Gommel et al.--.
Other Publications, under "Bednorz et al." "4/84." should read --3/84.--.

COLUMN 1

Line 14, "what" should read --which--.
Line 23, "abovemen-" should read --above-men- --.

COLUMN 2

Line 31, "non-metalic" should read --non-metallic--.
Line 37, "alic" should read --allic--.
Line 49, "engaged" should read --engages--.
Line 60, "the ball" should read --a ball--.
Line 60, "a" should read --the--.
Line 64, "Y-stage is used." should read --Y-stage.--.

UNITED STATES PATENT AND TRADEMARK OFFICE
CERTIFICATE OF CORRECTION

PATENT NO. : 4,766,465
DATED : August 23, 1988
INVENTOR(S) : KAZUO TAKAHASHI

It is certified that error appears in the above-identified patent and that said Letters Patent is hereby corrected as shown below:

COLUMN 3

Line 5, "non-metalic" should read --non-metallic--.
Line 15, "aluminium," should read --aluminum,--.
Line 40, "collosible" should read --corrosible--.

Signed and Sealed this

Eleventh Day of April, 1989

Attest:

DONALD J. QUIGG

*Attesting Officer*  *Commissioner of Patents and Trademarks*